United States Patent [19]
Gramann et al.

[11] Patent Number: 6,087,680
[45] Date of Patent: Jul. 11, 2000

[54] LED DEVICE

[75] Inventors: Wolfgang Gramann, Regensburg; Werner Späth, Holzkirchen; Günther Waitl; Herbert Brunner, both of Regensburg, all of Germany

[73] Assignee: Siemens Aktiengesellschaft, Munich, Germany

[21] Appl. No.: 09/127,529

[22] Filed: Jul. 31, 1998

Related U.S. Application Data

[63] Continuation-in-part of application No. PCT/DE97/00190, Jan. 31, 1997.

[51] Int. Cl.[7] .............................. H01L 33/00; G09G 3/32
[52] U.S. Cl. ............................. 257/91; 257/99; 313/500; 345/82
[58] Field of Search ................... 257/88–91, 93, 257/99; 345/82, 83; 313/500; 438/28

[56] References Cited

U.S. PATENT DOCUMENTS

| | | | |
|---|---|---|---|
| 4,445,132 | 4/1984 | Ichikawa et al. | 257/99 X |
| 4,853,593 | 8/1989 | Stein | 313/500 |
| 5,250,820 | 10/1993 | Sawase et al. | 257/99 |
| 5,475,241 | 12/1995 | Harrah et al. | 257/99 |

FOREIGN PATENT DOCUMENTS

| | | |
|---|---|---|
| 2223537 | 12/1972 | Germany . |
| 2139656B2 | 6/1981 | Germany . |
| 56-152281 | 11/1981 | Japan . |
| 57-045983 | 3/1982 | Japan . |
| 61-5585 | 1/1986 | Japan . |
| 61198690 | 9/1986 | Japan . |
| 7-76131 | 3/1995 | Japan . |
| 8018105 | 1/1996 | Japan . |

OTHER PUBLICATIONS

"The LED–Display ein vielseitiges Anzeigeelement", Hans–H. Cuno et al., elektronik industrie 1, 1981, p. 18–22.
"Monolithic Light–emitting Diode Array", H.D. Edmonds et al., IBM Technical Disclosure Bulletin, vol. 17, No. 1, Jun. 1974.

*Primary Examiner*—John Guay
*Attorney, Agent, or Firm*—Herbert L. Lerner; Laurence A. Greenberg; Werner H. Stemer

[57] ABSTRACT

An LED device includes at least one LED chip having a front contact metallization disposed on a light exit surface of a light-emitting member and a rear contact metallization disposed on a side of the light-emitting member opposite the light exit surface. The LED chip is disposed between first and second conductor track supports. The first conductor track support is transparent and has at least one first electric conductor contacting the front contact metallization. The second conductor track support has at least one second electric conductor contacting the rear contact metallization. The LED device has, inter alia, the special advantage of permitting the size of the LED chips to be reduced, in contrast with the chip size in conventional LED devices, thus allowing the luminous spot density to be increased.

33 Claims, 6 Drawing Sheets

LED DEVICE

CROSS-REFERENCE TO RELATED APPLICATION

This application is a continuation of copending International Application No. PCT/DE97/00190, filed Jan. 31, 1997, which designated the United States.

BACKGROUND OF THE INVENTION

Field of the Invention

The invention relates to an LED device including at least one LED chip having a front contact metallization disposed on a light exit surface of a light-emitting member, and a rear contact metallization disposed on a side of the light-emitting member opposite the light exit surface.

Such LED devices are known, for example, from an article entitled "Das LED-Display, ein vielseitiges Anzeigenelement" [The LED Display, a Versatile Display Element], by H. Cuno and A. Heider, in elektronik industrie 1-1991. Described therein is an LED segment in which an LED chip having a front contact metallization and a rear contact metallization is fastened with its rear to a first electric connecting part. The front contact metallization is provided with a contacting wire which connects the front contact metallization to a second electric connecting part.

LED devices of the type mentioned at the outset are also known in which a plurality of LED chips are fastened with their rear contact metallizations in accordance with a prescribed array to conductor tracks of a printed circuit board that interconnect the rear contact metallizations in an electrically conducting manner in rows or columns. The front contact metallizations are constructed as bonding pads and are interconnected in an electrically conducting manner in columns or rows through the use of bonding wires. A transparent plastic plate, which is built into a plastic housing together with the printed circuit board, is usually disposed over the LED chips in order to protect against mechanical damage.

In the case of so-called intelligent LED display devices which are commercially available, for example, under the designation "Intelligent Display" and are presently constructed in accordance with the principle described above, the rows and columns are connected to an electronic driving circuit which supplies the LED chips with current or current pulses (pulse code modulation) in such a way that they light up in accordance with a prescribed pattern. The driving circuit can, for example, be attached to the rear of the printed circuit board, or externally as well. Such intelligent LED display devices are used, for example, in mobile telephones for displaying telephone numbers and operating states, since they are self-luminous and therefore do not require any additional illumination such as is necessary, for example, in the case of LCD displays.

The known LED devices described above are produced through the use of conventional die bonding and wire bonding techniques. The front contact metallizations are constructed as bonding pads and thereby cover a part of the light exit surfaces of the LED chips. In order to ensure that the ratio of the light exit surface to the bonding pad surface, and thus the light yield from an LED chip does not become too small, it is not permitted with the conventional bonding techniques presently available for the cross section of the LED chip to fall below $0.2 \times 0.2$ mm$^2$ in plan view.

The costs, the weight and the dimensions of the above-mentioned LED devices depend substantially on the size of the LED chips. Likewise, the luminous spot density (number of light-emitting diodes per unit area), and thus also the image quality of the above-described LED displays depend substantially on the size of the individual LED chips and their mutual spacing. It is therefore particularly worth the attempt at reducing the overall size of the LED chips.

A reduction in the chip surface, for example to $0.15 \times 0.15$ mm$^2$ would require a conspicuous reduction in the bonding pad surface, in order to prevent the light yield from the LED chip from being drastically worsened at the same time. However, that would entail substantial technical problems in the case of the use of conventional bonding techniques.

SUMMARY OF THE INVENTION

It is accordingly an object of the invention to provide an LED device, which overcomes the hereinafore-mentioned disadvantages of the heretofore-known devices of this general type, in which the size of the LED chips is reduced and in which the LED device has a small overall size, a low weight, is capable of being produced cost-effectively and has high mechanical and thermal stability.

With the foregoing and other objects in view there is provided, in accordance with the invention, an LED device, comprising at least one LED chip having a light-emitting member with a light exit surface and a side opposite the light exit surface, a front contact metallization disposed on the light exit surface, and a rear contact metallization disposed the side opposite the light exit surface; and first and second conductor track supports between which the LED chip is disposed, the first conductor track support being transparent and having at least one first electric conductor contacting the front contact metallization, and the second conductor track support having at least one second electric conductor contacting the rear contact metallization.

The configuration according to the invention can be used both with devices having a plurality of LED chips and with devices having a single LED chip.

It is not necessary in the case of the LED device according to the invention for the front contact metallization of the LED chip to be provided with a bonding wire. Therefore, firstly it is advantageously possible for the front contact metallization to have a substantially smaller structure than previously. Secondly it is no longer the positioning tolerance of a wire bonder used for the production that is the decisive parameter for the size of the LED chip, but rather the accuracies with which the LED chip and the first electric conductor can be positioned on the first conductor track support. Moreover, the cross section of the first electric conductor can be distinctly reduced in contrast with the wire diameter of conventional bonding wires. For these reasons, it is possible to reduce the dimensions of the LED chip through the use of the LED device according to the invention and thus to raise the luminous spot density of LED displays. Moreover, it is also advantageously possible in the case of the LED device according to the invention to improve the light yield from the LED chips by contrast with the LED chips that are conventionally used.

The LED device according to the invention has the advantage of making it possible to use LED chips with the dimensions of, for example, $0.15 \times 0.15$ mm$^2$, $0.12 \times 0.12$ mm$^2$ or even smaller. Consequently, the material costs for LED devices and their weight can advantageously be distinctly lowered. In addition, the power consumption of the LED device according to the invention can advantageously be reduced in contrast with the conventional LED devices, since the light yield of LED chips mostly rises disproportionally with the current density.

In accordance with another feature of the invention, the front contact metallization of each LED chip has several contact metallization strips disposed at a spacing from one another. It is thereby possible in the case of an LED chip for the chip surface (light exit surface) covered by the front contact metallization to be further reduced, and thus for the light yield from the LED chip to be raised.

It is also advantageous for the contact metallization strips and the first electric conductor assigned to the LED chip to cross one another. As a result, the permissible positioning tolerances for the LED chip, the first electric conductor and the first conductor track support can advantageously be conspicuously increased.

In accordance with a further feature of the invention, each first electric conductor has a plurality of conductor track metallization strips or tracks applied to or constructed on the first conductor track support at a mutual spacing. As a result, the region on the first conductor track support that is covered by metallizations is once again advantageously reduced.

In order to improve the contacting reliability between the conductor track metallization strips and the front contact metallization, in a preferred development of the invention the conductor track metallization strips have widened parts, for example in the form of transverse webs, in the contact region with the front contact metallization.

In accordance with an added feature of the invention, in order to prevent reflection losses inside the LED device, free interspaces between the light exit surfaces of the LED chip and the first conductor track support, or also the entire free interspace between the first and the second conductor track supports can advantageously be filled with an optical coupling medium which reduces internal reflections in the LED device.

In accordance with an additional feature of the invention, a plurality of LED chips are disposed between the first and the second conductor track supports. A plurality of first electric conductors, each of which makes contact with the front contact metallization of at least one LED chip, is provided on the first conductor track support. Likewise, a plurality of second electric conductors, each of which makes contact with the rear contact metallization of at least one LED chip, is provided on the second conductor track support.

In accordance with yet another feature of the invention, in the last-mentioned embodiment, the LED chips are disposed on a second conductor track support, which includes a plurality of separate support beams that are provided with second electric conductors, for example metallizations, and have a rectangular cross section, for example. Each of these support beams extends over a group of LED chips. In the case of the use of materials having different coefficients of thermal expansion, it is possible for the first and second conductor track supports to achieve a reduction in the mechanical stresses inside the display device by employing these mutually separated support beams. Ideally, each second electric conductor is applied to or constructed on a separate support beam. To be precise, it is known that in the case of temperature fluctuations, different coefficients of thermal expansion of materials used in the LED device can cause mechanical stresses in the LED device which can lead to damage to the LED chips, for example.

In accordance with yet a further feature of the invention, instead of the support beams, it is possible to construct the second conductor track support as a single unipartite electrically insulating plate to which, or on which, the second electric conductor is applied or constructed.

In accordance with yet an added feature of the invention, in order to prevent the above-mentioned mechanical stresses as far as possible, the first and the second conductor track supports are produced from materials which have similar coefficients of thermal expansion.

In accordance with a concomitant feature of the invention, the second electric conductor or connector between the rear contact metallizations and the second electric conductors is constructed to be capable of plastic or elastic deformation. Tolerances in the chip dimensions and/or unevennesses in the first and/or second conductor track supports are therefore compensated by virtue of the fact that the second electric conductors or the connector between the rear contact metallizations and the second electric conductors can be correspondingly compressed.

In order to fulfill the same purpose, it is likewise conceivable for one or both conductor track supports to be advantageously constructed as an elastic foil (for example of plastic) which is provided with conductor tracks.

Of course, all combinations of the above-mentioned developments which appear sensible to the person skilled in the art also fall within the scope of the present invention.

For the sake of completeness, it may further be mentioned at this juncture that as a rule the front and rear of an LED chip respectively mean the viewing side and the mounting side of the chip.

Other features which are considered as characteristic for the invention are set forth in the appended claims.

Although the invention is illustrated and described herein as embodied in an LED device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
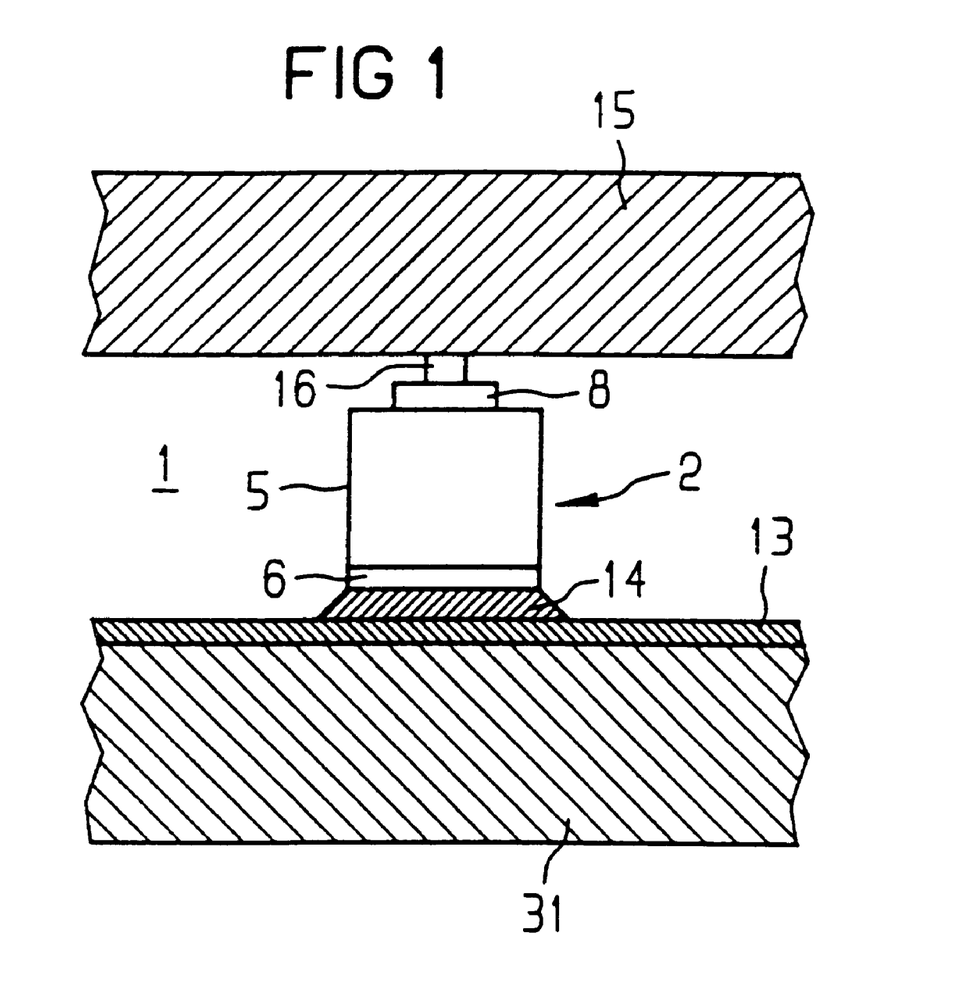
FIG. 1 is a fragmentary, diagrammatic, partly-sectional, side-elevational view of a first exemplary embodiment of the invention.
Figure 2A:
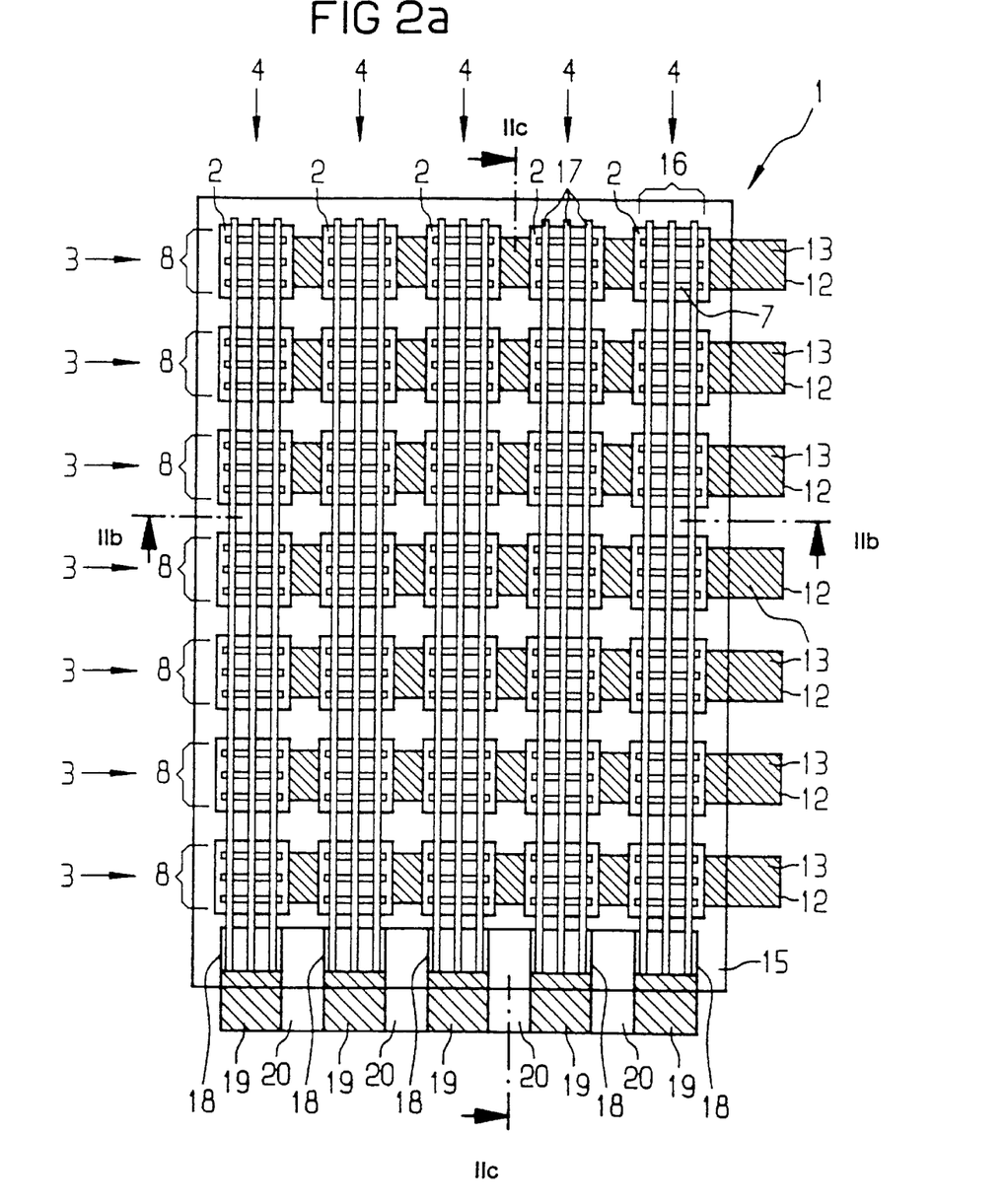
FIG. 2a is a plan view of a second exemplary embodiment of the invention.
Figure 2B:
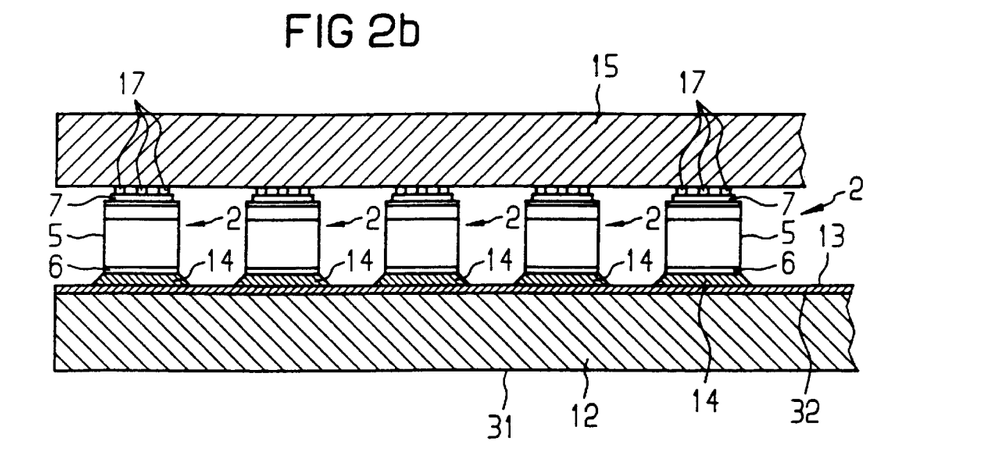
FIG. 2b is a fragmentary, sectional view of the second exemplary embodiment, which is taken along a line IIb—IIb of FIG. 2a, in the direction of the arrows.

Referring now to the figures of the drawings in detail and first, particularly, to FIG. 1 thereof, there is seen an LED device 1 in which an LED chip 2 has a semiconductor body 5 as a light-emitting member, a front contact metallization 8 applied to a light exit surface of the semiconductor body 5, and a rear contact metallization 6 applied to a side of the semiconductor body 5 opposite the light exit surface. The semiconductor body 5 is formed, for example, of a conventional light-emitting coating sequence of III/V semiconductor materials, or of other material combinations suitable for producing LED chips. FIGS. 2a and 2b and the associated descriptions thereof should be compared in this regard and with regard to the materials for the front contact metallization 8 and the rear contact metallization 6.

Generally speaking, the light exit surface of an LED chip 2 is duly understood as that side surface of the semiconductor body 5 through which the greatest part of the light emerges from the semiconductor body 5.

A transparent first conductor track support 15 with a first electric conductor 16 is disposed above the front of the LED chip 2. The first conductor track support 15 is, for example, a plate produced from glass, plastic, semiconductor material (for example SiC for $\lambda > 400$ nm, GaP for $\lambda > 550$ nm, GaAs for $\lambda > 900$ nm) or another suitable transparent material. A coating which is applied through the use of vapor deposition or sputtering and is made from Au, Al, an Al base alloy or another suitable electrically conducting material is used, for example, as the first electric conductor.

The first electric conductor 16 is connected to the front contact metallization 8, for example through the use of a metal solder (for example PbSn solder) or through the use of an electrically conducting adhesive. It is possible, for example, to use a laser soldering method for soldering purposes in which the laser beam is guided to the soldering point through the first conductor track support 15.

A second conductor track support 31, which is located on the rear of the LED chip 2 is formed, for example, of glass, glass ceramic, plastic, semiconductor material or metal. If an insulating material is used for the second conductor track support 31, a second electric conductor 13, for example in the form of a coating made from Au, Al and/or another suitable electrically conducting material, is constructed thereon. In the case of a second conductor track support 31 made from semiconductor material, the second electric conductor 13 can be constructed as a highly doped zone. The second electric conductor 13 or the conductor track support 31 is connected in an electrically conducting manner to the rear contact metallization 6, for example with the aid of a connector 14 made from metal solder or adhesive, etc.

In order to compensate for possible tolerances in the size of different LED chips and/or unevennesses in the conductor track supports 15, 31, the connector 14, the second electric conductor 13, the first conductor track support 15 and/or the second conductor track support 31 can be constructed to be capable of plastic or elastic deformation. The conductor track supports 15, 31 can be produced for this purpose from elastic plastic material, for example.

Figure 2C:
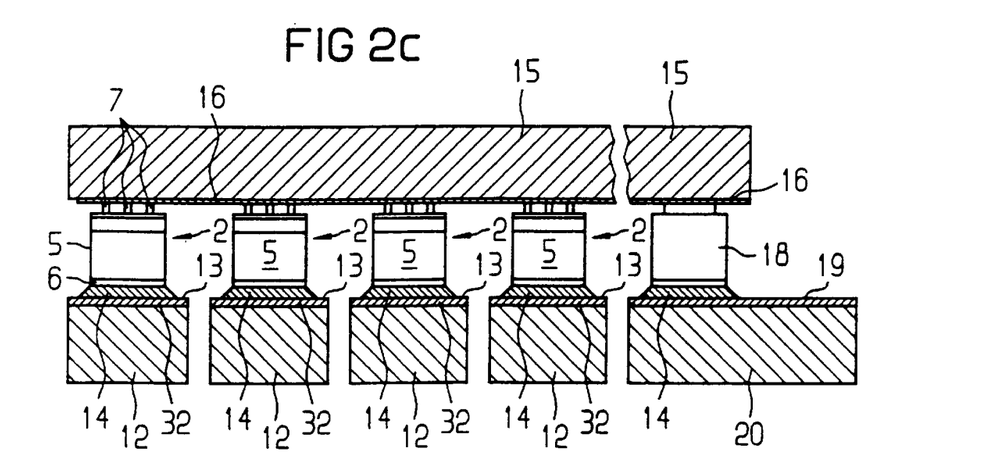
FIG. 2c is a fragmentary, sectional view of the second exemplary embodiment which is taken along a line IIc—IIc of FIG. 2a, in the direction of the arrows.

In the second exemplary embodiment of the LED device 1 according to the invention, which is represented in FIGS. 2a to 2c, the LED chips 2 are disposed in rows 3 and columns 4. The LED chips 2 each have a semiconductor body 5, a rear contact metallization 6 and a front contact metallization 8 including three metallization strips 7.

Figure 3A:
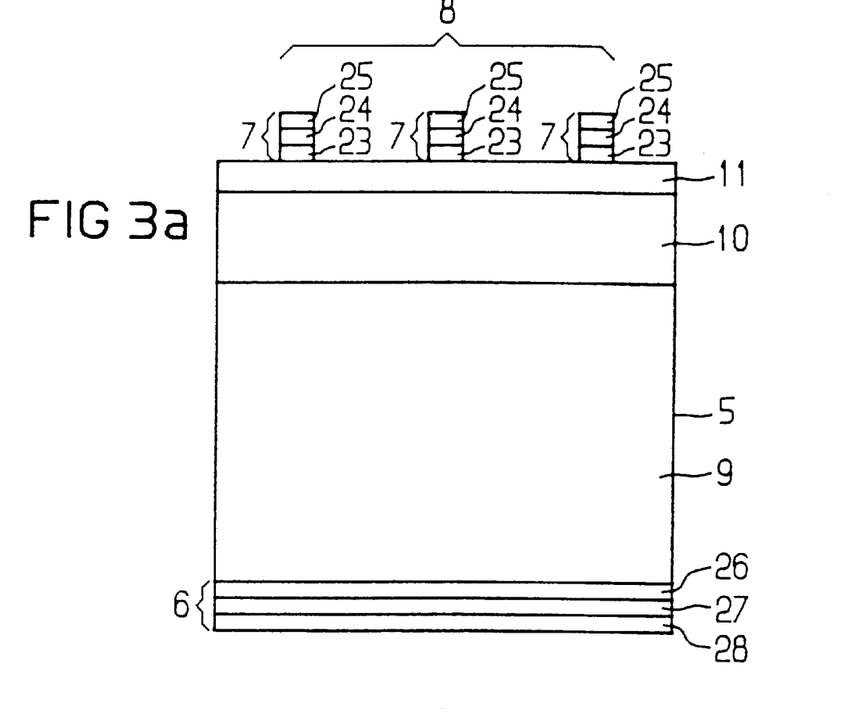
FIG. 3a is an elevational view of an LED chip used in the second exemplary embodiment.
Figure 3B:
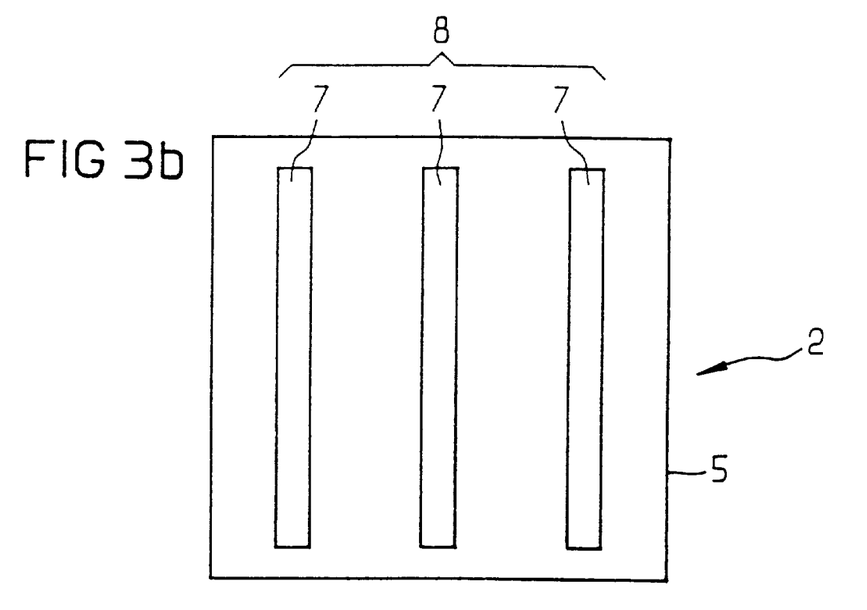
FIG. 3b is a plan view of an LED chip used in the second exemplary embodiment.

As is shown in FIGS. 3a and 3b, the semiconductor body 5 in this regard is composed, for example, of an n-conducting GaP substrate 9, an n-conducting GaAsP coating 10 disposed above the substrate 9, and a p-conducting GaAsP coating 11 disposed above the GaAsP coating 10. However, it can also have any other material combination or coating sequence suitable for producing light-emitting diodes. Light-emitting diodes made from $Ga_xAl_{x-1}As$ ($0 \leq x \leq 1$), (GaAlIn)P, $Ga_xIn_{x-1}As_yP_{1-y}$ ($0 \leq x \leq 1$; $0 \leq y \leq 1$), $Ga_xAl_{x-1}N$ ($0 \leq x \leq 1$), $Ga_xIn_{x-1}N$ ($0 \leq x \leq 1$), ZnSe and/or SiC, for example, are known.

The contact metallization strips 7 are produced, for example, through the use of vapor deposition or sputtering. In the second exemplary embodiment, these are p-metallizations which are composed, for example, in each case of a Ti coating 23 applied to the p-conducting GaAsP coating 11, a Pt coating 24 disposed above the Ti coating 23, and an AuSn coating 25 disposed above the Pt coating 23. The type of the metal and the coating sequence for the front contact metallizations 8 is, of course, dependent on the respective material combination of the semiconductor body 5 being used. It goes without saying, that the person skilled in the art can use any metallization he or she knows as being suitable for the respective semiconductor material.

The rear contact metallizations 6 likewise have, for example, a structure with three coatings, being formed of an AuGe coating 26 (99:1), an Ni coating 27 and an Au coating 28. In this case as well, the type of the metal being used depends on the material combination of the semiconductor body 5. As is seen in FIG. 2b, a plurality of support beams 12 is located beneath the LED chips 2. The second electric conductor 13, for example in the form of a metallization coating 32, is applied in each case to the front of the support beams 12. Each LED chip 2 is connected to the assigned second electric conductor 13 with the aid of an electrically conducting connector 14, for example a metal solder or an electrically conducting adhesive. The support beams 12 are disposed in such a way that the second electric conductor 13 of one support beam 12 in each case interconnects the rear contact metallizations 6 of the LED chips 2 belonging to a respective row 3 in an electrically conducting manner.

The support beams 12 can be produced, for example, from plastic, glass ceramic, glass, semiconductor material, epoxy resin, Pertinax or from another suitable material. The second electric conductors 13 are formed, for example, of Cu, Al, an Al base alloy or another suitable metallic material, and are, for example, applied to the support beams 12 through the use of vapor deposition or sputtering. It is likewise conceivable to make use of an electrically conducting material such as, for example, Cu or a semiconductor material, such as Si, for example, for the support beams 12 per se. In the case of electrically conducting support beams 12, there is no need for any metallization coatings 32. In the case of support beams 12 made from semiconductor material, instead of the metallization coatings 32, the fronts of the support beams 12 can be highly doped, and can thus have an adequate electric conductivity.

The transparent conductor track support 15 which is located above the LED chips 2 is formed, for example, of glass, plastic, semiconductor material or another suitable material. The conductor track support 15 has a plurality of conductor tracks extending in a mutually parallel manner, each of which is in turn formed of three conductor track metallization strips 17 extending in a mutually parallel manner, to form the first electric conductor 16. The conductor tracks are disposed in such a way that the front contact metallizations 8 of the LED chips 2 belonging to a column are interconnected in an electrically conducting manner in each case.

The conductor track metallization strips 17 in turn are formed, for example, of Au, Al, an Al base alloy or another suitable metallic material, and are applied to the conductor track support 15 through the use of vapor deposition or sputtering, for example. The number of the conductor track metallization strips 17 is arbitrary and not restricted to three. In the case of a conductor track support 15 made from semiconductor material such as, for example, Si, the first electric conductors 16 can be constructed as highly doped strips in the conductor track support 15.

As is shown in FIG. 2a, in each case a so-called jumper chip 18, for example a silicon chip, is located at the lower end of each column 4 between the conductor track support 15 and an anode connecting plate 20. The jumper chip 18 connects the first electric conductors 16 in an electrically conducting manner to an anode connecting metallization 19 located on the anode connecting plate 20. As a result, all of the terminals for the LED array of the rows 3 and the columns 4 are disposed in one plane. This has an advantageous effect for the further production processes such as, for example, connection to an electric driving circuit.

For the sake of completeness, it may be mentioned at this juncture that the number of the contact metallization strips 7 per front contact metallization 8, and the number of the conductor track metallization strips 17 per first electric conductor 16 can be arbitrary and are not restricted to three.

Figure 4:
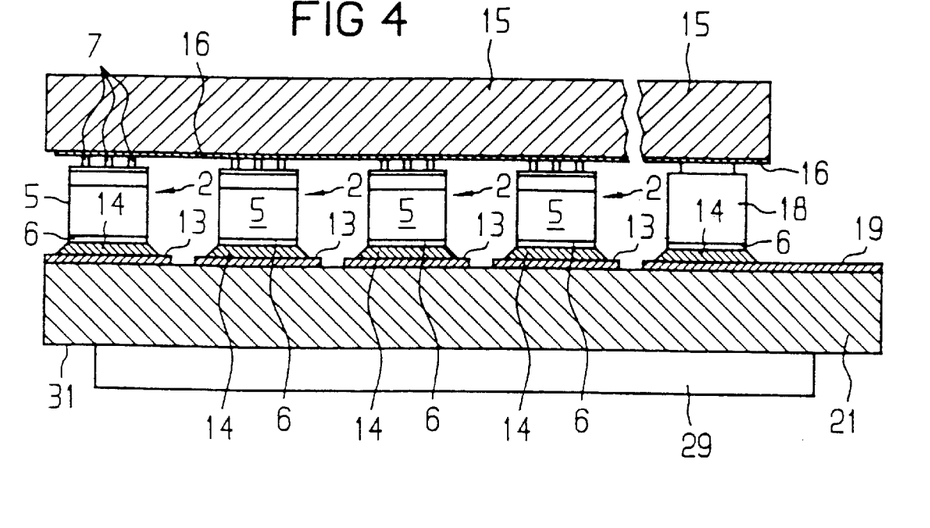
FIG. 4 is a partly-broken away, sectional view of a third exemplary embodiment of the LED device according to the invention.

The third exemplary embodiment of the LED device according to the invention, which is represented in FIG. 4, differs from the first exemplary embodiment essentially only in that a single electrically insulating plate 21 is used instead of the support beams 12. Second electric conductors 13 are applied to this electrically insulating plate 21, which is formed, for example, of glass, glass ceramic, semiconductor material, plastic (for example HT thermoplastic) or another suitable material. The second electric conductors 13 are, for example, metallization coatings produced through the use of vapor deposition or sputtering. In accordance with the second exemplary embodiment, the second electric conductors 13 interconnect the rear contact metallizations 6 of the respective LED chips 2 belonging to a row in an electrically conducting manner. Anode connecting metallizations 19 which are likewise applied to this plate 21 are connected in an electrically conducting manner to the first electric conductors 16 through jumper chips 18. The remaining constituents of the LED devices in accordance with the third exemplary embodiment according to FIG. 3 correspond to those of the second exemplary embodiment according to FIG. 2a and are provided with the same reference numerals.

In the case of a plate 21 made from semiconductor material, such as Si, for example, instead of metallization coatings and/or the anode connecting metallizations 19, it is possible to construct the plate 21 with highly doped zones which form the second electric conductors 13 or the anode terminals.

It is of essential importance in the third exemplary embodiment that as far as possible use is made of materials for the plate 21 and for the first conductor track support 15 which have a similar coefficient of thermal expansion. To be specific, in the case of temperature fluctuations, a strongly differing thermal expansion of the plate 21 and the conductor track support 15 would lead to substantial mechanical stresses in the LED device 1 which, as is known, can impair the functional properties and the resistance of LED devices to aging.

Figure 5:
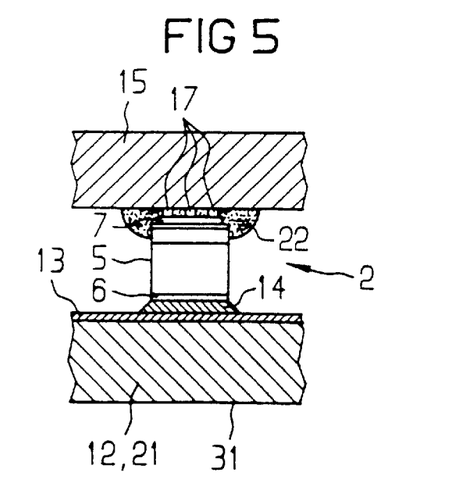
FIG. 5 is a fragmentary, sectional view of an LED device according to the invention, in which an optical coupling medium is disposed between the LED chip and a first conductor track support.
Figure 6:
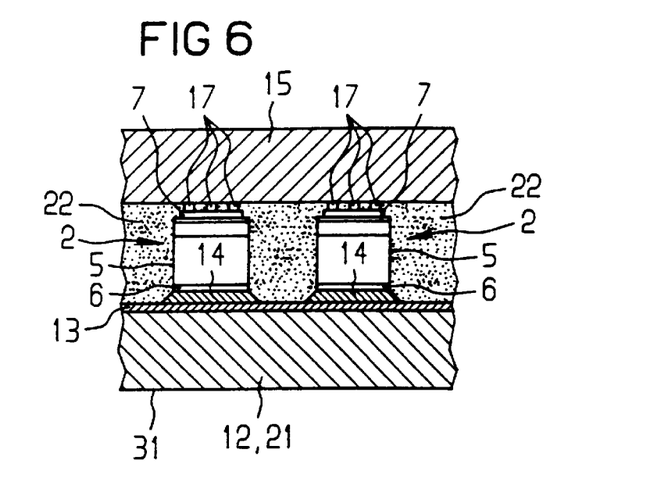
FIG. 6 is a fragmentary, sectional view of an LED device according to the invention, in which an interspace between the first and a second conductor track support is filled with an optical coupling medium.

As is shown in FIGS. 5 and 6, a coupling medium 22 may be used for the purpose of increasing the light extraction from the LED device 1. The coupling medium 22 may be disposed between the light exit surface of each LED chip 2 and the conductor track support 15, or an interspace between the support beam 12/plate 21 and the conductor track support 15 may be filled with the coupling medium 22. The coupling medium 22 can, for example, be formed of epoxy resin, silicon or another material known to the person skilled in the art as being suitable for this purpose.

It is also conceivable for the LED chips 2 to be disposed not in rows 3 and columns 4, but diagonally, annularly or in another way, and to be interconnected in such a way as to be subdivided into first and second groups.

In the case of the use of a plate 21 as the second conductor track support 31 for the second electric conductors 13, an electronic driving circuit 29 of the LED device 1 can be disposed on the rear of the plate 21, as is shown in FIG. 4.

Figure 7:
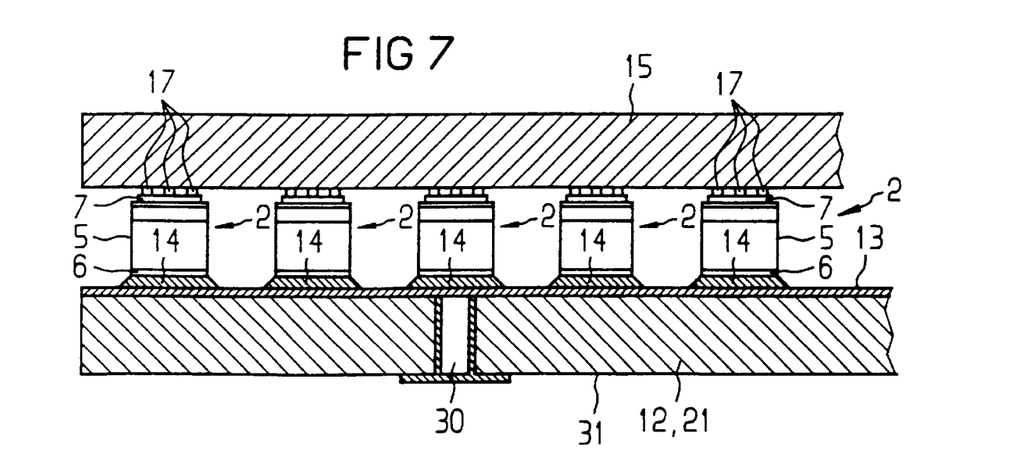
FIG. 7 is a fragmentary, sectional view of an LED device according to the invention, in which the second conductor track support has electrically conducting bushings.

It is further conceivable for the rear contact metallizations 6 and/or the second electric conductors 13 to be connected to the electronic driving circuit 29 through the use of electrically conducting bushings (vias) 30 passing through the plate 21, as is shown in FIG. 7. The production of a continuum of LED chips 2 is possible with this development of the invention.

Furthermore, it is possible for the plate 21 to be constructed as a so-called multilayer printed circuit board, as a result of which the area required for the conductor track configuration of the plate 21 can be reduced.

It is desirable to compensate for possible tolerances in the dimensions of the LED chips and/or unevennesses in the first and/or the second conductor track support 15 or 31 in the case of the second or third exemplary embodiment. Therefore, it is advantageously possible for the first conductor track support 15, the second conductor track support 31, the first electric conductors 16, the second electric conductors 13 and/or the connector 14 to be constructed to be capable of plastic or elastic deformation. As a result, the tolerances can be compensated for and it is ensured that there is a reliable connection between the first electric conductors 16 and the front contact metallizations 8 as well as between the second electric conductors 13 and the rear contact metallizations 6. Consequently, the first conductor track support 15 and/or the second conductor track support 31 can be constructed, for example, as a structured conducting foil being formed essentially of plastic.

Of course, the LED device according to the invention is not limited exclusively to the use of semiconductor LED chips, but can also be used, for example, where polymer LED chips are employed.

We claim:

1. An LED device, comprising:
   at least one LED chip having a light-emitting member with a light exit surface and a side opposite said light exit surface, a front contact metallization disposed on said light exit surface, and a rear contact metallization disposed on said side opposite said light exit surface;
   first and second conductor track supports between which said LED chip is disposed, said first conductor track support being transparent and having at least one first electric conductor contacting said front contact metallization, and said second conductor track support having at least one second electric conductor contacting said rear contact metallization; and said at least one first electric conductor having a plurality of mutually spaced-apart conductor tracks on said first conductor track support.

2. The LED device according to claim 1, wherein said front contact metallization has several mutually spaced-apart contact metallization strips.

3. The LED device according to claim 1, wherein
at least one of said conductor track supports is produced from an elastic foil.

4. The LED device according to claim 2, wherein said mutually spaced-apart contact metallization strips each cross said conductor tracks of said first electric conductor associated with said front contact metallization.

5. The LED device according to claim 1, including an optical coupling medium filling a free interspace between said light exit surface of said LED chip and said first conductor track support.

6. An LED device, comprising:
a plurality of LED chips each having a light-emitting member with a light exit surface and a side opposite said light exit surface, a front contact metallization disposed on said light exit surface, and a rear contact metallization disposed on said side opposite said light exit surface;

first and second conductor track supports between which said LED chip is disposed, said first conductor track support being transparent and having a plurality of first electric conductors thereon contacting said front contact metallization, and said second conductor track support having a plurality of second electric conductors thereon contacting said rear contact metallization;

said LED chips disposed between said first and second conductor track supports;

said first electric conductors each contacting said front contact metallization of at least one of said LED chips; and said second electric conductors each contacting said rear contact metallization of at least one of said LED chips.

7. The LED device according to claim 6, wherein said LED chips are disposed in rows and columns, said front contact metallizations of said LED chips of each column are each interconnected in an electrically conducting manner by said first electric conductors, and said rear contact metallizations of said LED chips of each row are each interconnected in an electrically conducting manner by said second electric conductors.

8. The LED device according to claim 6, wherein said second conductor track support has a plurality of support beams mutually spaced apart and disposed next to one another and metallization coatings applied as said second electric conductors.

9. The LED device according to claim 6, wherein said second conductor track support has a plurality of support beams mutually spaced apart, disposed next to one another and at least partially including electrically conducting material.

10. The LED device according to claim 7, wherein said second conductor track support has a plurality of support beams mutually spaced apart and disposed next to one another and metallization coatings applied as said second electric conductors.

11. The LED device according to claim 7, wherein said second conductor track support has a plurality of support beams mutually spaced apart, disposed next to one another and at least partially including electrically conducting material.

12. The LED device according to claim 8, wherein each of said second electric conductors is applied to a separate support beam.

13. The LED device according to claim 9, wherein each of said second electric conductors is applied to a separate support beam.

14. The LED device according to claim 10, wherein each of said second electric conductors is applied to a separate support beam.

15. The LED device according to claim 11, wherein each of said second electric conductors is applied to a separate support beam.

16. The LED device according to claim 8, wherein each of said second electric conductors is a separate support beam.

17. The LED device according to claim 9, wherein each of said second electric conductors is a separate support beam.

18. The LED device according to claim 10, wherein each of said second electric conductors is a separate support beam.

19. The LED device according to claim 11, wherein each of said second electric conductors is a separate support beam.

20. The LED device according to claim 6, wherein said second conductor track support has an electrically insulating plate on which all of said second electric conductors are disposed.

21. The LED device according to claim 7, wherein said second conductor track support has an electrically insulating plate on which all of said second electric conductors are disposed.

22. The LED device according to claim 1, wherein said first and second conductor track supports are formed of materials having a similar coefficient of thermal expansion.

23. The LED device according to claim 1, wherein said first conductor track support is produced from an elastic material.

24. The LED device according to claim 1, wherein said second conductor track support is produced from an elastic material.

25. The LED device according to claim 1, wherein said at least one second conductor is capable of at least one of elastic and plastic deformation.

26. The LED device according to claim 1, including an elastically or plastically deformable electrically conducting connector connecting said at least one second electric conductor to said associated rear contact metallization.

27. The LED device according to claim 6, wherein said first conductor track support is produced from an elastic material.

28. The LED device according to claim 6, wherein said second conductor track support is produced from an elastic material.

29. The LED device according to claim 6, wherein said at least one second conductor is capable of at least one of elastic and plastic deformation.

30. The LED device according to claim 6, including an elastically or plastically deformable electrically conducting connector connecting said at least one second electric conductor to said associated rear contact metallization.

31. The LED device according to claim 6, wherein at least one of said conductor track supports is produced from an elastic foil.

32. The LED device according to claim 3, wherein at least one of said conductor track supports is produced from an elastic foil made of plastic.

33. The LED device according to claim 31, wherein at least one of said conductor track supports is produced from an elastic foil made of plastic.

* * * * *